(12) United States Patent
Suzuki

(10) Patent No.: US 6,268,906 B1
(45) Date of Patent: Jul. 31, 2001

(54) EXPOSURE APPARATUS AND EXPOSURE METHOD

(75) Inventor: Kazuaki Suzuki, Kawasaki (JP)

(73) Assignee: Nikon Corporation, Tokyo (JP)

( * ) Notice: Subject to any disclaimer, the term of this patent is extended or adjusted under 35 U.S.C. 154(b) by 0 days.

(21) Appl. No.: 09/271,212

(22) Filed: Mar. 17, 1999

Related U.S. Application Data

(63) Continuation of application No. 08/763,869, filed on Dec. 11, 1996, now abandoned, which is a continuation of application No. 08/396,326, filed on Feb. 28, 1995, now abandoned, which is a continuation of application No. 08/209,269, filed on Mar. 14, 1994, now abandoned.

(30) Foreign Application Priority Data

Mar. 15, 1993 (JP) .................................................. 5-053449

(51) Int. Cl.[7] ............................. G03B 27/42; G03B 27/54
(52) U.S. Cl. ................................. 355/67; 355/53; 355/68; 355/69
(58) Field of Search .................................. 355/53, 54, 67, 355/68, 69, 71, 77; 356/399, 400, 401; 372/24, 25

(56) References Cited

U.S. PATENT DOCUMENTS

| | | | | |
|---|---|---|---|---|
| 4,711,568 | * | 12/1987 | Torigoe et al. | 355/68 |
| 4,822,975 | | 4/1989 | Torigoe . | |
| 4,884,101 | * | 11/1989 | Tanimoto | 355/68 |
| 4,970,546 | * | 11/1990 | Suzuki et al. | 355/53 |
| 5,053,614 | * | 10/1991 | Yui et al. | 355/68 |
| 5,097,291 | * | 3/1992 | Suzuki | 355/69 |
| 5,107,275 | * | 4/1992 | Tsuruoka et al. | 346/108 |
| 5,119,390 | * | 6/1992 | Ohmori | 372/25 |
| 5,121,160 | * | 6/1992 | Sano et al. | 355/53 |
| 5,171,965 | * | 12/1992 | Suzuki et al. | 250/492.1 |
| 5,191,374 | * | 3/1993 | Hazama et al. | 355/53 |
| 5,250,797 | * | 10/1993 | Sano et al. | 355/68 |
| 5,291,240 | * | 3/1994 | Jain | 355/53 |
| 5,343,270 | * | 8/1994 | Sakakibara et al. | 355/53 |
| 5,473,412 | * | 12/1995 | Ozawa | 355/53 |
| 5,475,491 | * | 12/1995 | Shiozawa | 355/68 |
| 6,011,612 | * | 1/2000 | Go et al. | 355/69 |

FOREIGN PATENT DOCUMENTS

| | | |
|---|---|---|
| 63-316430 | 12/1988 | (JP) . |
| 2-135723 | 5/1990 | (JP) . |
| 97/37283 | 10/1997 | (WO) . |

OTHER PUBLICATIONS

"Exposure Dose Control Techniques for Excimer Loser Lithography" by David H. Tracy and Fred Y Wu published in Proceedings of the SPIE, vol. 922, Optical/Laser Microlithography, pp. 437–443; 1998.*

* cited by examiner

Primary Examiner—Alan A. Mathews
(74) Attorney, Agent, or Firm—Vorys, Sater, Seymour and Pease LLP

(57) ABSTRACT

In a slit scan type projection exposure apparatus, a predetermined number of pulsed lights are emitted from a pulsed light source to transfer a pattern on a reticle to a wafer while the reticle and the wafer are scanned at a constant speed with respect to an exposure area on the wafer. At that time, not only fluctuations of the energies of the pulsed lights but also fluctuations of light emission timing of the pulsed lights are taken into consideration.

54 Claims, 3 Drawing Sheets

EXPOSURE APPARATUS AND EXPOSURE METHOD

CROSS-REFERENCE TO APPLICATIONS

This application is a continuation of application Ser. No. 08/763,869 filed Dec. 11, 1996, which is a continuation of application Ser. No. 08/396,326 filed Feb. 28, 1995, which is a continuation of application Ser. No. 08/209,269 filed Mar. 14, 1994 (all abandoned).

BACKGROUND OF THE INVENTION

1. Field of the Invention

The present invention relates to an exposure apparatus and an exposure control method and more particularly to a slit scan type exposure apparatus equipped with an exposure control device for controlling an exposure amount and uniformity of luminous intensity to a sensitive substrate within a predetermined range wherein a mask and the sensitive substrate are scanned synchronously to expose a pattern of the mask on the photosensitive substrate an exposure method by use with the apparatus.

Also, the present invention relates to an exposure control device for controlling an exposure amount and uniformity of luminous intensity to a sensitive substrate within a predetermined range and an exposure control method for the same.

2. Related Background Art

In manufacturing semiconductors, liquid crystal display devices or thin film magnetic heads, etc. under photolithography technique, projection exposure apparatuses have been utilized in which the pattern of a photomask or a reticle (hereinafter called the reticle) is exposed via a projection optical system on a photosensitive substrate such as a wafer with photoresist applied thereto, a glass plate or the like. Recently, a chip pattern of a semiconductor, etc. tends to become large and in the projection exposure apparatus, it is required to expose a larger portion of the pattern of a reticle on the photosensitive substrate.

Also, as the pattern of a semiconductor, etc. becomes minute, improvement of resolution of the projection optical system is required. In order to improve the resolution of the projection optical system, the exposure field of the projection optical system needs to be enlarged, which but is difficult in respect to the design or manufacture. Especially, when using a reflective and refractive system as the projection optical system, there is a case that the shape of the exposure field with no aberration happens to be circular.

In order to deal with the problems of the tendency of enlargement of the pattern to be exposed and the limitation of the exposure field of the projection optical system, a method has been proposed in which a reticle and a photosensitive substrate are scanned synchronously with respect to, e.g., a rectangular, circular or hexagonal illumination area (hereinafter called the slit-shaped illumination area). That is, a so-called slit scan type projection exposure apparatus has been developed in which the pattern of a reticle larger than a slit-shaped illumination area on the reticle is exposed on a photosensitive substrate, as disclosed in U.S. Pat. No. 4,822,975.

Generally, in the projection exposure apparatus, the condition of a proper exposure amount and uniformity of luminous intensity with respect to a photosensitive material of the photosensitive substrate is determined. Therefore, the slit scan type projection exposure apparatus is also provided with an exposure amount control device which makes an exposure amount to the photosensitive substrate coincide with a proper exposure amount within a predetermined allowable range and maintains the uniformity of the luminous intensity of exposure lights to the photosensitive substrate within a predetermined level.

Also, recently, it is required to enhance the resolution of the pattern to be exposed on the photosensitive substrate. A method for enhancing the resolution is to use shortwave exposure lights. Among presently usable light sources, an excimer laser light source, a pulse oscillation type laser source (pulsed light source) such as a metallic vaporization laser light source or the like emits shortwave exposure lights. However, the exposure energies (light amounts) of pulsed lights emitted from the pulsed light source are fluctuated for the respective pulses within a predetermined range.

Consequently, the exposure amount control device is controlled such that after the end of exposure, an integrated exposure amount becomes a proper exposure amount within an allowable range. In the conventional exposure amount control device, when the average pulsed light amount of pulsed lights from the pulsed light source is <p> and the range of the fluctuations of the light amounts of the pulsed lights is Δp, the parameter Δp/<p> representing the fluctuations of the light amounts of the pulsed lights is deemed to become a normal distribution (actually random).

When the number N of pulsed lights emitted so as to be the proper exposure amount (to a certain area (pulsed light integrated area) on the photosensitive substrate which is scanned relatively with respect to an exposure area conjugate to the slit-shaped illumination area) is N, the exposure amount control device is controlled by using the fact that the fluctuations of the integrated exposure amount after the end of exposure becomes $(\Delta p/<p>)/N^{1/2}$.

When performing exposures by use with the pulsed light source in the slit scan exposure method, how the light emission timing of the pulsed light source is set becomes a problem. For this matter, conventionally, when scanning the reticle and the photosensitive substrate synchronously, a light emission trigger signal is sent to the pulsed light source each time a stage on the side of the substrate is moved for a predetermined distance. That is, a length measurement unit (e.g., laser interferometer) which measures the moving amount of the stage on the side of the substrate for scanning the substrate is utilized. And, light emission is performed in synchronism with the output of the length measurement unit.

In the above conventional technique, although the fluctuations of the light amounts of the pulsed lights emitted from the pulsed light source is taken into consideration, the fluctuations of the light emission timing (the fluctuations of periods when the pulsed light source actually emits a pulsed light each time after a light emission trigger signal is sent to the pulsed light source) are not taken into consideration. However the inventors of the present invention found that the light emission timing of the pulsed light source affects the control accuracy of the exposure amount and the uniformity of luminous intensity.

Further, generally, in the length measurement unit (laser interferometer or the like), there are fluctuations of the time when after performing actual measurement, it outputs the result of the measurement. Therefore, in such a method for making the pulsed light source emit a pulsed light in synchronism with the output of the length measurement unit, the fluctuations of the timing of reading the measurement result is added to the light emission timing of the pulsed light source. Accordingly, it is not possible to maintain the control accuracy of the exposure amount and the uniformity of luminous intensity within the allowable range because of the influence of the fluctuations of the timing reading the measurement results and the light emission timing of the pulsed light source.

SUMMARY OF THE INVENTION

In view of the above problems, it is an object of a present invention to provide an exposure apparatus capable of improving the control accuracy of an exposure amount and the uniformity of luminous intensity to a photosensitive substrate when exposing a pattern of a mask on the photosensitive substrate by use with a pulsed light source in a slit scan exposure method.

For achieving the above and other objects, an exposure apparatus for transferring a pattern on a mask to a substrate comprises a light source for emitting pulsed lights; an illumination optical system for illuminating the mask with the pulsed lights; a mask stage supporting the mask and being movable in a predetermined plane; a substrate stage supporting the substrate and being movable in a plane parallel to the predetermined plane; a drive section for moving the mask stage and the substrate stage synchronously; input means for inputting fluctuations of energies of a plurality of pulsed lights and fluctuations of the light emission timing of the plurality of pulsed lights; first calculating means for calculating the minimum number of pulses for a predetermined number of pulsed lights to be emitted to the substrate based on the fluctuations of the energies of the plurality of pulsed lights and the fluctuations of the light emission timing of the plurality of pulsed lights; second calculating means for calculating the moving speed of the mask stage and the substrate stage based on the light emission timing of the plurality of pulsed lights and the minimum number of pulses; a drive control section for controlling the drive section so as to move the mask stage and the substrate stage synchronously based on the calculated moving speed; and a control section for outputting a signal to said light source at regular intervals to emit said pulsed lights.

According to the above embodiment, not only the fluctuations of the energies of the pulsed lights but also the fluctuations of the light emission timing are taken into consideration, the control accuracy of the exposure amount and the uniformity of the luminous intensity is improved. Also, the light emission triggers are supplied to the pulsed light source at regular intervals and the scan speed of the mask is the same with that of the photosensitive substrate, so that the control accuracy of the exposure amount and the uniformity of the luminous intensity is further improved without being influenced by fluctuations of the timing of reading the measurement result of a length measurement unit such as a laser interferometer.

It is an object of the present invention to provide an exposure method capable of improving control accuracy of an exposure amount and uniformity of luminous intensity to a photosensitive substrate when exposing a pattern of a mask on the photosensitive substrate by a pulsed light source in a slit scan exposure method.

For achieving the above and objects, in a second preferred embodiment, in a method of transferring a pattern on a mask to a substrate by use with a light source for emitting pulsed lights, an illumination optical system for illuminating the mask with the pulsed lights, a mask stage supporting the mask and being movable in a predetermined plane, a substrate stage supporting the mask and being movable in a plane parallel to the predetermined plane and a driven section for moving the mask stage and the substrate synchronously, there are the step of inputting fluctuations of respective energies of a plurality of pulsed lights and fluctuations of light emission timing of the plurality of pulsed lights prior to exposing the substrate; the step of calculating the minimum number of pulses for a predetermined number of pulsed lights to be emitted to the substrate based on the fluctuations of the energies of the plurality of pulsed lights and the fluctuations of the light emission timing of the plurality of pulsed lights; the step of calculating a moving speed of the mask stage and the substrate stage based on the light emission timing and the minimum number of pulses; the step of moving the mask stage and the substrate based on the calculated moving speed; and the step of emitting the predetermined number of pulsed lights at regular intervals at the time of exposing the substrate.

Also, it is an object of the present invention to provide an exposure control device capable of improving the control accuracy of an exposure amount and the uniformity of the luminous intensity to a photosensitive substrate.

For achieving the above and other objects, in a third preferred embodiment, in an exposure control device being provided in an exposure apparatus which has a pulsed light source for emitting pulsed lights in accordance with respective light emission trigger signals from outside the pulsed light source, an illumination optical system for illuminating a predetermined illumination area on a mask with the pulsed lights and scan means for scanning the mask and a substrate relatively with respect to the predetermined illumination area and exposes a pattern of the mask on the substrate while scanning the mask and the substrate relatively with respect to the predetermined illumination area, the exposure control device being for controlling an integrated exposure amount of the pulsed lights to the substrate and uniformity of luminous intensity on the substrate within predetermined accuracy, there is monitor means for measuring an energy of each of the pulsed lights to be emitted to the substrate and light emission timing of the pulsed lights; a control section for emitting a plurality of pulsed lights from the pulsed light source prior to exposing the substrate; first calculating means for calculating the average value of the energies of the plurality of pulsed lights and fluctuations of the light emission based on the measurement result of the monitor means; second calculating means for calculating the minimum number of pulses for a predetermined number of pulsed lights to be emitted to the substrate based on the fluctuations of the pulse energies and the fluctuations of the light emission timing calculated by the first calculating means, the minimum number being necessary for controlling the integrated exposure amount to the substrate and the uniformity of luminous intensity on the substrate within the predetermined accuracy; light amount control means for controlling the energies of the predetermined number of pulsed light to be emitted to the substrate based on the minimum number of pulses for the predetermined number of pulsed lights, a proper exposure amount and the average value of the plurality of pulse energies obtained by the first calculating means; and light emission control means for supplying the light emission trigger signals at regular intervals to the pulsed light source so as to emit the respective pulsed lights.

Also, it is an object of the present invention to provide an exposure control method capable of improving the control accuracy of an exposing amount and the uniformity of the luminous intensity to a photosensitive substrate.

For achieving the above and other objects, in a fourth preferred embodiment, in an exposure control method for controlling an integrated exposure amount of a predetermined number of pulsed lights emitted from a pulsed light source to a substrate and uniformity of luminous intensity on the substrate in predetermined accuracy, there are the first process of obtaining, by emitting a plurality of pulsed lights from the pulsed light source prior to exposing the substrate, the average value of respective energies of the plurality of pulsed lights, fluctuations of the energies of the plurality of pulsed lights and fluctuations of light emission timing of the plurality of pulsed lights;

the second process of obtaining the minimum number of pulses for the predetermined number of pulsed lights to be emitted to the substrate based on the fluctuations of the energies and the fluctuations of the light emission timing obtained in the first process, the minimum number being necessary for controlling said integrated exposure amount to the substrate and the uniformity of luminous intensity on the substrate within the predetermined accuracy;

the third process of controlling the energies of the predetermined number of pulsed lights to be emitted to the substrate based on the minimum number of pulses, a proper exposure amount to the substrate and the average value of the energies obtained in the first process; and a fourth process of sending a light emission trigger signal at regular intervals to the pulsed light source so as to emit the pulsed lights.

DETAILED DESCRIPTION OF THE PREFERRED EMBODIMENT

An embodiment of the present invention will be described with reference to the accompanied drawings. In this embodiment, the present invention is applied to a slit scan type projection exposure apparatus which has a pulse oscillation type light source such as a laser light source.

Figure 1:
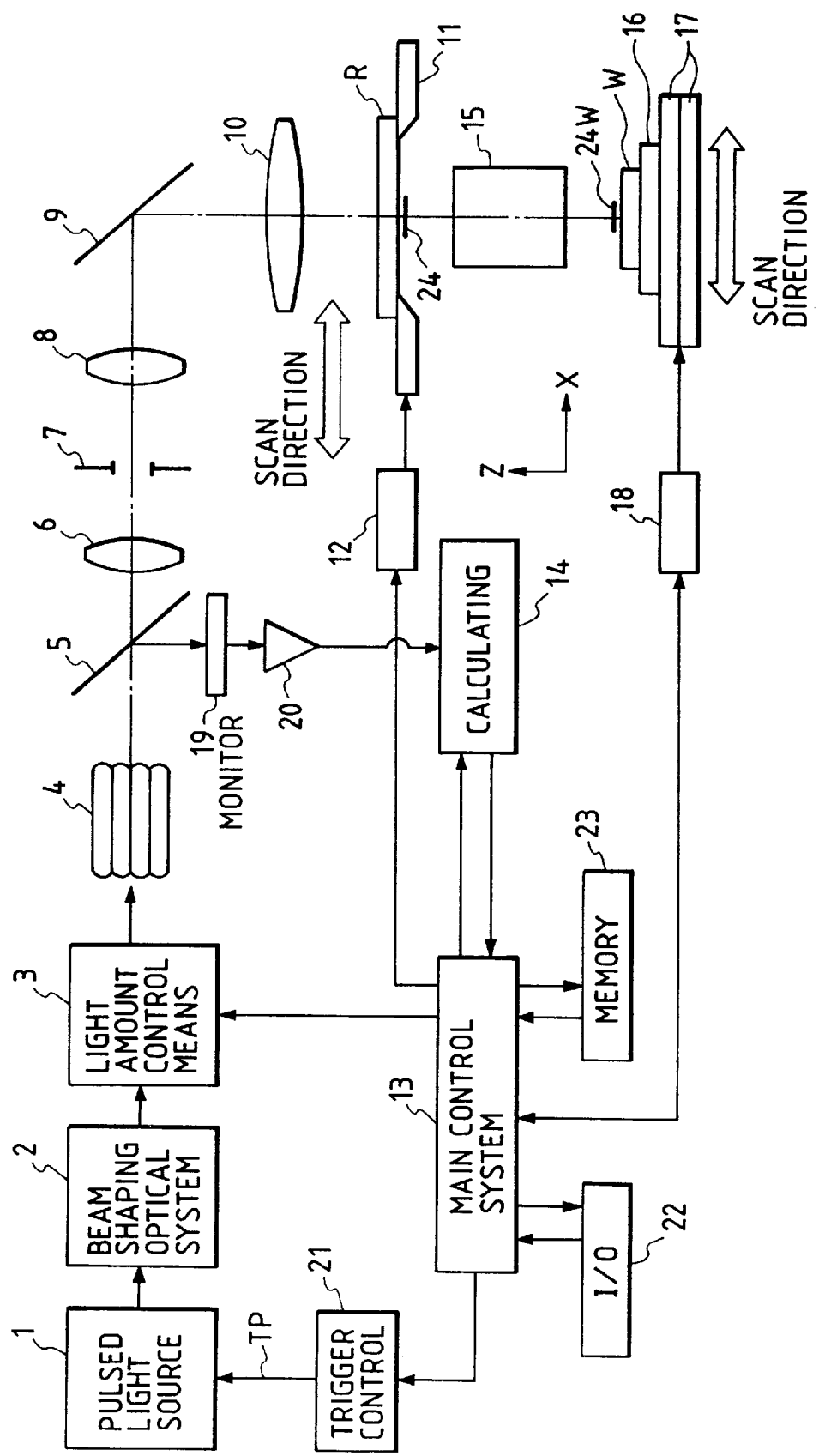
FIG. 1 is a schematic diagram showing the construction of a slit scan type projection exposure apparatus of an embodiment according to the present invention.

FIG. 1 shows the projection exposure apparatus of the embodiment. A laser beam emitted from a pulse oscillation type pulsed light source 1 enters a beam shaping optical system 2. The beam shaping optical system 2 is constituted of cylindrical lenses or a beam expander and shapes the cross section of the laser beam such that the laser beam is incident on a fly eye lens 4 efficiently.

The laser beam emanated from the beam shaping optical system 2 enters a light amount control means 3 which has a coarse control portion and a fine control portion for controlling the transmittance.

The laser beam emitted from the light amount control means 3 goes to the fly eye lens 4 which is provided for illuminating a field stop 7 and a reticle R disposed in succession after the fly eye lens 4 with uniform luminous intensity.

The laser beam from the fly eye lens 4 enters a beam splitter 5 with a small reflectance and a large transmittance.

The laser beam passed through the beam splitter 5 illuminates the field stop 7 with uniform luminous intensity by means of a first relay lens 6. In this embodiment, the shape of the opening portion of the field stop 7 is rectangular.

The laser beam passed through the field stop 7 is incident via a second relay lens 8, a bending mirror 9 and a condenser lens 10 on the reticle R on a reticle stage 11. The laser beam from the field stop 7 illuminates the reticle R with uniform luminous intensity.

The field stop 7, the pattern formed surface of the reticle R and the exposure surface of a wafer W are conjugate. And, the laser beam passing through the reticle R enters a rectangular slit-shaped illumination area 24 which is conjugate with the opening portion of the field stop 7 and disposed on the reticle R from under. It is possible to adjust the configuration of the slit-shaped illumination area 24 by changing that of the opening portion of the field stop 7 by means of a drive section (not shown).

A portion of the pattern of the reticle R corresponding to the slit-shaped illumination area 24 is projected and exposed on a portion of the wafer W via a projection optical system 15. An exposure area 24W of the wafer W is conjugate with the slit-shaped illumination area 24 respect to the projection optical system 15.

Then, when the Z-coordinate is defined parallel to the optical axis of the projection optical system 15 and the scan direction of the reticle R with respect to the slit-like illumination area 24 (with respect to the optical axis of the projection optical system 15) within a plane perpendicular to the optical axis is set to be the X direction, the reticle stage 11 is scanned by a reticle stage driving unit 12 in the X direction.

The reticle stage driving unit 12 is controlled by a main control system 13 for controlling the entire operation of the apparatus. Also, the reticle stage driving unit 12 is provided therein with a length measurement device (laser interferometer or the like) for detecting a X-coordinate in the X direction of the reticle stage 11. The length measurement device in the reticle stage drive unit 12 supplies the measured X-coordinate to the main control system.

On the other hand, the wafer W is disposed via a wafer holder 16 on a XY stage 17 which can be scanned at least in the X direction (the lateral directions in FIG. 1). Also, a Z stage (not shown) for positioning the wafer W in the Z direction or the like is disposed between the XY stage 17 and the wafer holder 16.

In the slit scan exposure, when the reticle R is scanned in the +X direction (or -X direction), the wafer W is scanned synchronously in the -X direction (or +X direction) with respect to the exposure area 24W by means of the XY stage 17.

The main control system 13 controls the operation of the XY stage 17 via a wafer stage driving unit 18. The wafer stage driving unit 18 is provided therein with a length measurement device for detecting coordinates in the X and Y directions of the XY stage 17. The length measurement device in the wafer stage drive unit 18 supplies the measured X and Y-coordinates of the XY stage 17 to the main control system 13.

The laser beam reflected from the beam splitter is received by an exposure light amount monitor 19 formed of a photoelectric converter device. A photoelectric converting signal from the exposure light amount monitor 19 is sent to a calculating unit 14 via an amplifier 20. The relationship of the photoelectric converting signal and the luminous intensity of the pulsed light on the exposure surface of the wafer W is obtained in advance. That is, the photoelectric converting signal of the monitor 19 is calibrated in advance.

The calculating unit 14 measures fluctuations of the light amounts of pulsed lights and the emission timing of the respective pulsed lights by photoelectric converting signals from the monitor 19. The fluctuations of the light amounts of the pulsed lights as well as the fluctuations of the emission timing of the pulsed lights are supplied to the main control system 13. Also, at the time of each exposure, the calculating unit 14 integrates the photoelectric converting signal for each of pulsed lights to obtain the integrated exposure amount to the wafer W. The calculating unit 14 supplies the integrated exposure amount to the main control system 13.

The main control system 13 supplies a light emission trigger signal TP to the pulsed light source 1 via a trigger controller 21 to control the light emission timing of the pulsed light source 1.

Also, based on the timing of supplying light emission trigger signals TP via the trigger controller 21 to the pulsed light source 1 and the light receiving timing detected by the calculating unit 14, the calculating unit 14 calculates the fluctuations of the light emission timing (fluctuations of periods when the pulsed light source 1 emits actually a pulsed light after each light emission trigger is supplied to the pulsed light source 1) of the pulsed light source 1.

Further, the main control system 13 controls the output power of the pulsed light source 1 or the transmittance of the light amount control means 3 as required. An operator can input various information such as the information of the pattern of the reticle R, the width D (cm) of the slit-shaped exposure area 24W on the surface of the wafer W in the scan direction, the oscillation frequency f (Hz) of the pulsed light source 1, etc. to the main control system 13 via an input/output means 22. The main control system 13 is equipped with a memory 23 for storing such various information (information of the pattern, etc.).

Figure 2:
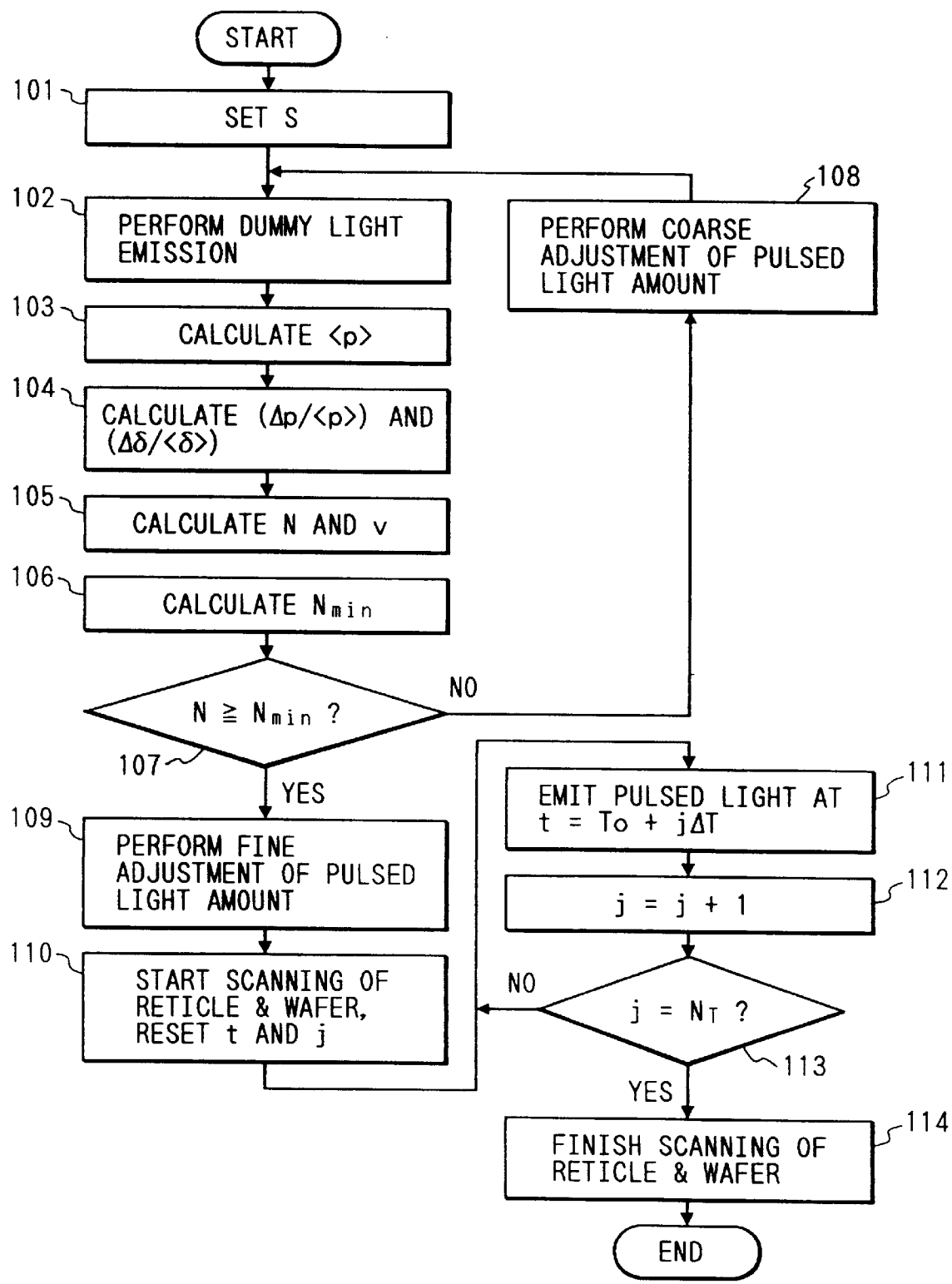
FIG. 2 is a flowchart showing the exposure operation of the apparatus of FIG. 1.

Next, an example of an operation for exposing the pattern of the reticle R on the wafer W with reference to the flowchart of FIG. 2.

First, in the step 101 of FIG. 1, the operator sets a desired exposure amount S (mJ/cm$^2$) on the surface of the wafer W to the main control system 13 via the input/output means 22.

Next, in the step 102, the main control system 13 imparts instructions for dummy light emission to the trigger controller 21. Then, with the wafer W retreated to the area where the wafer W will not be exposed (area outside the exposure area 24W), the experimental light emission (dummy light emission) of the pulsed light source 1 is performed. In the dummy light emission, pulsed light for, e.g., about 100 pulses are emitted. The distribution of the pulsed light amounts and the distribution of the light emission timing become approximately normal distributions as shown in FIG. 3. The distributions of the pulsed light amounts and the light emission timing are known from the photoelectric converting signals from the exposure light amount monitor 19.

Figure 3A:
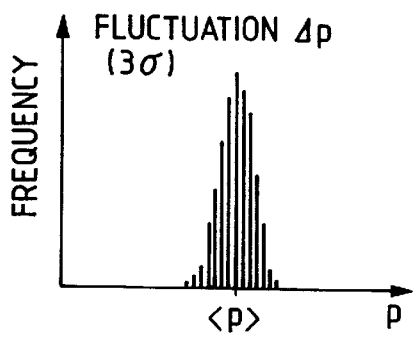
FIG. 3A is a graph showing the distribution of the light amounts of pulsed lights.

FIG. 3A shows the distribution of the values (mJ/cm$^2$) of the light amounts P (reduced values to the exposure surface of the wafer W) of the respective pulsed lights measured in the dummy light emission. Also, FIG. 3B shows the distribution of the light emission timing δ (sec) of the pulsed light source 1 measured in the dummy light emission.

Figure 3B:
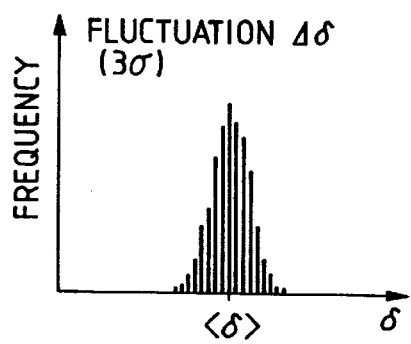
FIG. 3B is a graph showing the distribution of the light emission timing.

In the step 103, the calculating unit 14 obtains the average pulsed light amount <p> (mJ/cm$^2$) on the exposure surface of the wafer W from the distribution data of the pulsed light amounts P shown in FIG. 3A and the average value <δ> of the fluctuations of the light emission timing from the distribution data of the light emission timing δ shown in FIG. 3B.

Thereafter, in the step 104, the calculating unit 14 obtains the deviations Δp of the pulsed light amounts at three times the standard deviation (3σ) from the distribution data of the pulsed light amounts p of FIG. 3A. Also, the calculating unit 14 obtains the deviations Δδ of the light emission timing at three times the standard deviation from the distribution data of the light emission timing δ of FIG. 3B. Then, the calculating unit 14 calculates the fluctuations (Δp/<p>) of the pulsed light amounts and the fluctuations (Δδ/<δ>) of the light emission timing.

Next, in the step 105, the desired exposure amount S (mJ/cm$^2$) specified via the input/output means 22 is sent from the main control system 13 to the calculating unit 14, which then calculates the number N of exposure pulses by use with the desired exposure amount S and the average pulsed light amount <p> calculated in the step 103 from the following equation:

$$N = \text{int}\,(S/<p>), \qquad (1)$$

wherein int (A) represents the integer obtained by discarding the decimal fraction of the real number A.

Also, the main control system 13 sends the information such as the width D (cm) of the slit-shaped exposure area 24W on the wafer W in the scan direction and the oscillation frequency f (Hz) of the pulsed light source 1 from the memory 23 to the calculating unit 14. The calculating unit 14 obtains the scan speed v (cm/sec) on the surface of the wafer by use with the number N of exposure pulses, the width D and the frequency f from the following equation:

$$V = \frac{D \cdot f}{N} \qquad (2)$$

Thereafter, in the step 106, the calculating unit 14 calculates the minimum number Nmin of exposure pulses. The minimum number Nmin of exposure pulses is necessary for controlling the integrated exposure amount on the exposure surface of the wafer W and the uniformity of the luminous intensity within predetermined accuracy. The equation for calculating the minimum number Nmin of exposure pulses will be described in detail later. The number N of exposure pulses and the minimum number Nmin of exposure pulses are supplied to the main control system 13.

Next, in the step 107, the main control system 13 compares the number N of exposure pulses with the minimum number Nmin of exposure pulses. When N<Nmin holds as the result of the comparison, the main control system 13 lowers the transmittance of the light amount control means 3 (coarse adjustment) as in the step 108. Thereafter, the steps 102 to 107 are repeated and the number N of exposure pulses is again compared with the minimum number Nmin of exposure pulses. Accordingly, the transmittance of the light amount control means 3 is set such that N≧Nmin holds finally. As an example of means for performing the coarse adjustment of the transmittance, there is a device formed by mounting a plurality of ND filters with different transmittances to a turret plate, as disclosed in Japanese Patent Laid-Open Application No. 63-316430 and U.S. Pat. No. 4,970,546.

Next, when N≧Nmin in the step 107, the fine adjustment of pulsed light amounts is performed. That is, the average pulsed light amount <p> is finely adjusted such that S/<p> in the equation (1) becomes as integer. At this time, as the scan speed v has been determined in accordance with the number N of exposure pulses obtained from the equation (1) in the step 105, it is preferable to adjust the pulsed light amounts finely so as not to change the number N of exposure pulses, i.e., so as to make the average pulsed light amount <p> slightly larger. On the other hand, if the average pulsed light amount <p> becomes slightly smaller by the fine adjustment of the pulsed light amounts so that the number N of exposure pulses becomes N+1, the scan speed v should be calculated again by the equation (2).

As an example of the fine adjusting means for adjusting pulsed light energies finely, there is means with two gratings which is disposed along the optical light path of pulsed lights and formed with respective line and space patterns arranged at the same pitch and a mechanism for moving the two gratings slightly laterally with respect to each other, as disclosed in the Japanese Patent Application Laid-open No. 2-135723. When utilizing these two gratings, pulsed lights in areas where bright portions of the first grating overlap with those of the second grating are directed to the wafer. Therefore, it is possible to regulate the amounts of pulsed lights directed toward the wafer W finely by controlling the relative lateral moving amount of the two gratings.

Then, in the step 110, the main control system 13 starts scanning the reticle R and the wafer W via the reticle stage 11 and the XY stage 17 under the wafer W respectively. In FIG. 1, e.g., when the reticle R is scanned in the X direction, the wafer W is scanned in the −X direction. Also, although the scan speed V (reduced value on the exposure surface of the waferW) of the reticler R and the wafer W is determined by the equation (2) in this embodiment, the time for making the scan speed of the XY stage 17 under the wafer W reach the scan speed v after the start of scanning is set to be $T_0$.

Further, after resetting the time t and the parameter j to zero at the time of the start of scanning, and when the time t becomes $(T_0+j\Delta T)$, the main control system 13 supplies a light emission trigger signal TP (a pulse of the high level "1") via the trigger controller 21 to the pulsed light source 1. Accordingly, the pulsed light source 1 emits a pulsed light to expose a portion of the pattern of the reticle R on a portion of the wafer W.

Figure 5:
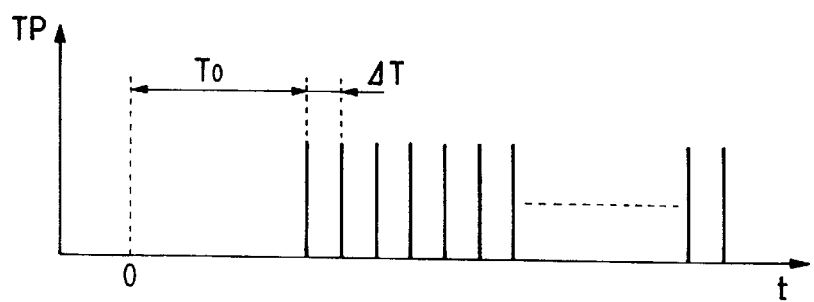
FIG. 5 is a timing chart showing light emission trigger pulses supplied to a pulsed light source.

FIG. 5 shows the light emission trigger signal TP. From the moment when the time t reaches $T_0$, the light emission trigger signal TP is emitted in constant cycles $\Delta T$. Thereby, the pulsed light source 1 emits a pulsed light in each cycle $\Delta T$ and the oscillation frequency f is expressed by $1/\Delta T$. The oscillation frequency f is the value stored in the memory 23 in advance. Then, in the step 112, 1 is added to the parameter j. When the parameter j has not reached the integer $N_T$, the pulsed light source 1 emits a pulsed light on the constant frequency (in the constant cycles AT) until the light emissions of $N_t$ pulses are performed.

When the width of a shot area on the wafer n the scan direction (X direction) is L1 and the width of the exposure area 24W in the scan direction is D, the minimum number $N_T$ of pulsed lights is as follows since the distance by which the wafer W is scanned per a cycle of the light emission of the pulsed light source 1 is v/f.

$$N_T=(L1+D)/(v/f)=(L1+D) f/v.$$

Actually, at the start and end of scanning, a predetermined number of pulsed lights are added. Then, in the step 113, when the number of emitted pulsed lights has reached $N_t$, the main control system 13 finishes the scanning and exposure of the reticle R and the wafer W in the step 114. Consequently, the whole pattern of the reticle R is transferred to a shot area of the wafer W. In this case, the light emission of the pulsed light source 1 is performed on the constant frequency regardless of the X-coordinate of the reticle stage 11 and the X-coordinate of the XY stage 17 on the side of the wafer W in this embodiment. However, the main control system 13 scans the reticle stage 11 and the XY stage at respectively constant speeds via the reticle stage driving unit 12 and the wafer stage driving unit 18. Therefore, in this embodiment, even though the time for measuring the X-coordinate of the reticle stage 11 or the time for measuring the X-coordinate of the XY stage 17 on the side of the wafer W is varied, the oscillation frequency of the pulsed light source 1 will not be influenced by that matter and the integrated exposure amount with respect to the wafer W and the uniformity of the luminous intensity are maintained in the desired accuracy.

Next, the method of calculating the minimum number Nmin of exposure pulses in the step 106 of FIG. 2 will be described. First, although the illumination field (illumination area 24) and the exposure area 24W on the wafer W are formed by the field stop 7 in FIG. 1, the shapes of the luminous intensity distributions along the cross sections of the illumination area 24 and the exposure area 24W in the scan direction are ideally rectangular. However, actually, the shapes thereof become like trapezoids as shown in FIG. 4 owing to the positioning error of the field stop 7, aberrations of the optical system, etc.

Figure 4:
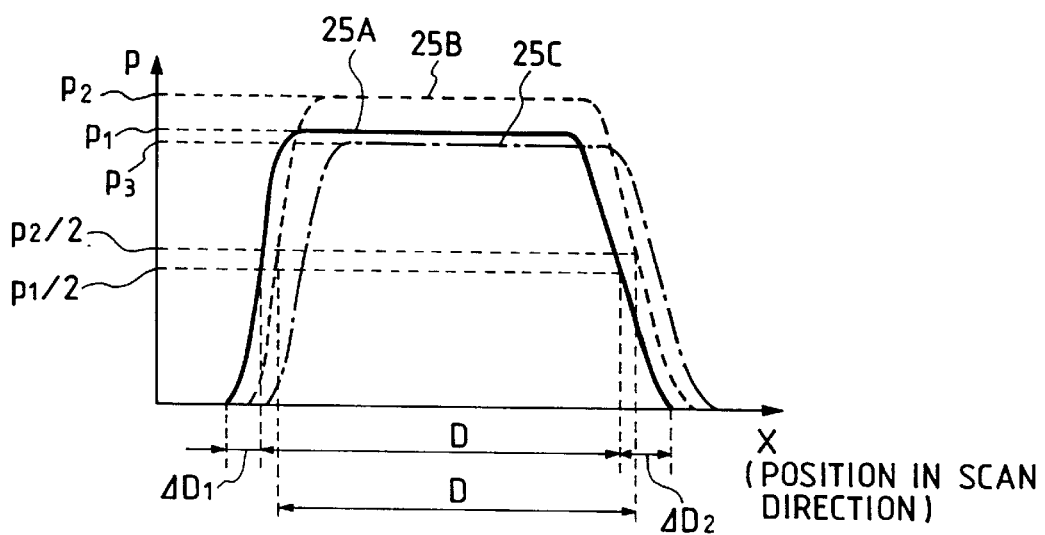
FIG. 4 is a graph showing the luminous intensity distribution of pulsed lights on the surface of a wafer.

FIG. 4 shows luminous intensity distributions of respective pulsed lights with respect to the X position on the wafer W in the scan direction by the function p of the position X. For example, if light emitted from a point in the opening portion of the field stop 7 is blurred on a circular area with the radius $\Delta D$ on the wafer W with uniform luminous intensity, the slope portions of the trapezoid like luminous intensity distribution are proved easily to be the following function of a variable $(X/\Delta D)$:

$$p(X/\Delta D) = \frac{1}{\pi}\left\{\arccos\left(\frac{X}{\Delta D}\right)-\left(\frac{X}{\Delta D}\right)\sqrt{1-\left(\frac{X}{\Delta D}\right)^2}\right\} \quad (3)$$

$$\left(-1 \leq \frac{X}{\Delta D} \leq +1\right)$$

FIG. 4 shows the luminous intensity distributions along the cross sections with blurred portions by the distribution curves 25A, 25B and 25C for the respective pulsed lights. The actual width of the exposure area 24W in the scan direction is about a few mm and the width $\Delta D$ of the blurred portions is about 10 μm or more, so the luminous intensity distributions along the cross sections of FIG. 4 are approximately rectangular. The peak values of the distribution curves 25A, 25B and 25C are p1, p2 and p3 and the width of the distribution curves 25A, 25B and 25C in the scan direction at positions where the values p1, p2 and p3 become half is D commonly. Then, the width D can be deemed to be the width of the exposure area 24W in the scan direction.

Further, in FIG. 4, the peak values p1, p2 and p3 respectively for the first pulse (distribution curve 25A), the second pulse (distribution curve 25B) and the third pulse (distribution curve 25C) are varied due to the fluctuations of the pulsed light amounts and the intervals of the emissions of the pulsed lights are not also constant due to the fluctuations of the light emission timing. Here, in the slope portions on the lateral sides of the distribution curve 25A for the first pulse, when the number of pulses for overlapped exposures on and after the second pulse with respect to areas (with the widths $\Delta D_1$ and $\Delta D_2$) where the light amount values are half the peak value or less is $N_1$ or $N_2$, the following equations hold:

$$N_1 = \text{int}\left(\frac{\Delta D_1}{D} \cdot N\right), \quad (4)$$

$$N_2 = \text{int}\left(\frac{\Delta D_2}{D} \cdot N\right).$$

That is, as the number of pulses for exposures during the scanning of the exposure area with the width D is N (equation (1)), pulsed lights the number of which is proportional to each of the widths $\Delta D_1$ and $\Delta D_2$ are emitted to the respective areas with the respective widths $\Delta D_1$ and $\Delta D_2$. At this time, the accuracy A of the exposure amount after the scan exposure and the uniformity of the luminous intensity is expressed by the following equation. For example, when the accuracy is 1%, A is 0.01.

$$A = +\left\{1 - \frac{N_1 + N_2 + 1}{2N} + \left(\frac{D}{2N \cdot \Delta D_1}\right)^2 \frac{N_1}{3N}(N_1+1)(2N_1+1) + \right. \quad (5)$$

$$\left. \left(\frac{D}{2N \cdot \Delta D_2}\right)^2 \frac{N_2}{3N}(N_2+1)(2N_2+1)\right\}^{\frac{1}{2}} \times \frac{1}{\sqrt{N}}\left(\frac{\Delta p}{\langle p \rangle}\right) +$$

$$\left\{\frac{2N_1+1}{(2\Delta D_1)^2} + \frac{2N_2+1}{(2\Delta D_2)^2}\right\}^{\frac{1}{2}}\left\{\left(\frac{\Delta p}{\langle p \rangle}\right)^2 + \left(\frac{\Delta \delta}{\langle \delta \rangle}\right)^2\right\}^{\frac{1}{2}} \frac{|X|}{N} +$$

$$\left|\frac{2N_2+1}{2\Delta D_2} - \frac{2N_1+1}{2\Delta D_1}\right|\frac{|X|}{N}, \left(-\frac{D}{N} \leq X \leq +\frac{D}{N}\right)$$

In the right side of the equation, the first member is produced by the fluctuations of the light amounts of pulsed lights, the second member is produced by the fluctuations of the light amounts of the pulsed lights and the fluctuations of the light emission timing and the third member expresses the deterioration of the uniformity of luminous intensity caused by the dissymmetry of the blurred portions in the exposure area 24W. The widths D, $\Delta D_1$ and $\Delta D_2$ are stored in the memory 23 as the constants of the apparatus in this embodiment. However, the function of measuring the widths D, $\Delta D_1$ and $\Delta D_2$ may be provided in the exposure apparatus. Also, ($\Delta p/\langle p \rangle$) and ($\Delta \delta/\langle \delta \rangle$) are obtained by the actual measurement as in the step 104. Accordingly, the minimum number Nmin can be obtained by substituting the desired accuracy A in the equation (5) and solving N.

In the above embodiment, the description of control means for reducing the interference pattern produced by the spatial coherency of the pulsed light source 1 and unevenness of illumination (speckle) is omitted. Generally, the excimer laser has preferable spatial coherency, so that the exposure apparatus using the excimer laser light source is equipped with interference pattern reducing means and exposure control is performed while reducing the interference pattern by exposures for a plurality of pulses (e.g., U.S. Pat. No. 4,970,546). In this case, the larger number between the minimum number of exposure pulses necessary for reducing the interference pattern and the minimum number Nmin of exposure pulses obtained from the equations (4) and (5) should be determined as Nmin.

Although the exposure amount monitor 19 is provided in the illumination optical system, the monitor 19 may be substituted for a sensor provided on the wafer stage (16, 17). However, such a sensor provided on the wafer stage can be used only in the dummy light emission of the pulsed light source 1. Then, another exposure amount monitor is required when actual exposures are performed to the wafer W.

Also, the slit-shaped illumination area is in the shape of a rectangular in this embodiment, but may be in the shape of a hexagon, rhomb or a circle. Further, the projection optical system 15 may be a refractive type, a reflective type or a refractive and reflective type. And, the pulsed light source 1 may be a plasma X-ray light source, a synchrotron radiation apparatus (SOR) other than the laser light source. Furthermore, needless to say, the present invention are effective not only in the projection exposure apparatus but also in a contact type or a proximity type exposure apparatus.

It will be understood that various structural changes and modifications may be made without departing from the scope of the invention set forth in the accompanying claims.

What is claimed is:

1. An exposure apparatus for transferring a pattern on a mask to a substrate, comprising:

a light source for emitting pulsed lights;

an illumination optical system for illuminating said mask with said pulsed lights;

a mask stage supporting said mask and being movable in a predetermined plane;

a substrate stage supporting said substrate and being movable in a plane conjugate with said predetermined plane;

a drive system for moving said mask stage and said substrate stage synchronously;

an input device for inputting fluctuations of respective energies of said pulsed lights and fluctuations of light emission timing of said pulsed lights;

a first calculating system for calculating the minimum number of pulses for said pulsed lights to be emitted to said substrate based on the fluctuations of said energies of said pulsed lights and the fluctuations of said light emission timing of said pulsed lights;

a second calculation system for calculating a moving speed of said mask stage and said substrate stage based on said minimum number of pulses for said pulsed lights;

a drive control system for controlling said drive system so as to move said mask stage and said substrate stage synchronously based on said calculated moving speed; and a control system for controlling said light source so as to emit said pulsed lights at regular intervals.

2. An apparatus according to claim 1, wherein said input device further comprises:

a memory for storing said light emission timing:

a detector for receiving respective portions of said pulsed lights;

measuring system for measuring said energies of said pulsed lights and said light emission timing of said pulsed lights based on signals from said detector;

a third calculating system for calculating the fluctuations of said energies of said pulsed lights and the fluctuations of said light emission timing of said pulsed lights based on said stored light emission timing and the measured data of said measuring section.

3. An apparatus according to claim 2, wherein said third calculating system calculates the average value of said energies of said plurality of pulsed lights.

4. An apparatus according to claim 3, further comprising:

an energy control system for controlling said energies of said pulsed lights based on said minimum number of pulses, a predetermined integrated exposure amount to said substrate and the average value of said energies of said pulsed lights.

5. An apparatus according to claim 1, wherein said minimum number of pulses is necessary for controlling an integrated exposure amount to said substrate and uniformity of luminous intensity on said substrate within predetermined accuracy.

6. A method of transferring a pattern on a mask to a substrate by use with a light source for emitting pulsed lights, an illumination optical system for illuminating said mask with said pulsed lights, a mask stage supporting said mask and being movable in a predetermined plane, a substrate stage supporting said substrate and being movable in a plane conjugate with said predetermined plane and a drive section for moving said mask stage and said substrate stage synchronously, said method comprising:

the step of obtaining fluctuations of respective energies of said pulsed lights and fluctuations of light emission timing of said pulsed lights prior to exposing said substrate;

the step of calculating the minimum number of pulses for pulsed lights to be emitted to said substrate based on the fluctuations of said energies of said pulsed lights and the fluctuations of said light emission timing of said pulsed lights;

the step of calculating a moving speed of said mask stage and said substrate stage based on said minimum number of pulses;

the step of moving said mask stage and said substrate based on said calculated moving speed; and the step of emitting said pulsed lights at regular intervals at the time of exposing said substrate.

7. An exposure control device being provided in an exposure apparatus which has a pulsed light source for emitting pulsed lights in accordance with respective light emission trigger signals from outside said pulsed light source, an illumination optical system for illuminating a predetermined illumination area on a mask with said pulsed lights and a scan system for scanning said mask and a substrate relatively with respect to said predetermined illumination area and which exposes a pattern of said mask on said substrate while scanning said mask and said substrate relatively with respect to said predetermined illumination area, said exposure control device being for controlling an integrated exposure amount of said pulsed lights to said substrate and uniformity of luminous intensity on said substrate within predetermined accuracy, said exposure control device comprising:

a monitor for measuring an energy of each of said pulsed lights to be emitted to said substrate and light emission timing of said pulsed lights;

a control system for emitting said pulsed lights from said pulsed light source prior to exposing said substrate;

a first calculating system for calculating the average value of said energies of said pulsed lights, fluctuations of said energies of said pulsed lights and fluctuations of said light emission timing of the pulsed lights based on the measurement result of said monitor;

a second calculating system for calculating the minimum number of pulses for said pulsed lights to be emitted to said substrate based on the fluctuations of said pulse energies and the fluctuations of said light emission timing calculated by said first calculating system, said minimum number being necessary for controlling said integrated exposure amount to said substrate and said uniformity of luminous intensity on said substrate within said predetermined accuracy;

a light amount control system for controlling said energies of said pulsed lights to be emitted to said substrate based on said minimum number of pulses for said pulsed lights, a proper exposure amount and the average value of said energies obtained by said first calculation system; and a control system for controlling said light source so as to emit said pulsed lights at regular intervals.

8. An exposure control method for controlling an integrated exposure amount of pulsed lights emitted from a pulsed light source to a substrate and uniformity of luminous intensity on said substrate in predetermined accuracy, said exposure control method being utilized in an exposure method which comprises processes of emitting said pulsed lights to a predetermined illumination area on a mask and scanning said mask and said substrate relatively with respect to said predetermined illumination area, said exposure control method comprising:

a first process of obtaining, by emitting said pulsed lights from said pulsed light source prior to exposing said substrate, the average value of respective energies of said pulsed lights, fluctuations of said energies of said pulsed lights and fluctuations of light emission timing of said pulsed lights;

a second process of obtaining the minimum number of pulses for said pulsed lights to be emitted to said substrate based on the fluctuations of said energies and the fluctuations of said light emission timing obtained in the first process, said minimum number being necessary for controlling said integrated exposure amount to said substrate and the uniformity of luminous intensity on said substrate within the predetermined accuracy;

a third process of controlling said energies of said pulsed lights to be emitted to said substrate based on said minimum number of pulses, a proper exposure amount to said substrate and the average value of said energies obtained in the first process; and a fourth process of controlling said light source so as to emit said pulsed lights at regular intervals.

9. An exposure apparatus for transferring a pattern on a mask to a substrate, comprising:

a light source for emitting pulsed lights;

an illumination optical system for illuminating said mask with said pulsed lights, a mask stage supporting said mask and being movable in a predetermined plane;

a substrate stage supporting said substrate and being movable in a plane conjugate with said predetermined plane;

a drive system for moving said mask stage and said substrate stage synchronously;

a drive control system for controlling said drive system based on a minimum number of pulses of said pulsed lights for controlling an integrated exposure amount and uniformity of luminous intensity; and a control system for controlling said light source so as to emit said pulsed lights at regular intervals.

10. An exposure apparatus to transfer a pattern on a mask onto a substrate while synchronously moving said mask and substrate, comprising:

a light source to emit a pulsed light beam onto said substrate;

an illumination optical system, disposed between said light source and said mask, to form a light intensity distribution of a trapezoid shape on said substrate in a moving direction of the substrate;

a drive system which drives said mask and said substrate synchronously; and a control system, connected to said light source and said drive system, which controls a timing of emission of said pulsed light beam so that a product of moving distance of said substrate during a cycle of the pulsed light beam emission and number of pulses emitted on each point of said substrate becomes equal to half width of said trapezoid shape intensity distribution, wherein said half width corresponds to a width in the moving direction of said substrate at ½ of a peak intensity level in said intensity distribution.

11. An exposure apparatus to transfer a pattern on a mask onto a substrate while synchronously moving said mask and substrate, comprising:

a light source which emits a pulsed light beam onto said substrate; and a control system which controls emission of said pulsed light beam based on fluctuations of emission timing of said a pulsed light beam.

12. An exposure method to transfer a pattern on a mask onto a substrate while synchronously moving said mask and said substrate, comprising:

emitting a pulsed light beam from a light source onto said substrate; and controlling emission of said pulsed light beam based on fluctuations of emission timing of said pulsed light beam.

13. An exposure method to transfer a pattern on a mask onto a substrate while synchronously moving said mask and substrate, comprising the steps of:

illuminating said substrate with a pulsed beam emitted from a beam source, said pulsed beam having an intensity distribution on said substrate, wherein the intensity distribution is a substantially trapezoidal shape in a moving direction of the substrate;

controlling a timing of emission of said pulsed light beam so that a product of moving distance of said substrate during a cycle of the pulsed light beam emission and number of pulses emitted on each point of the substrate becomes equal to half width of said intensity distribution, wherein said half width corresponds to a width in the moving direction of said substrate at ½ of a peak intensity level in said intensity distribution.

14. A scanning exposure method comprising detecting a plurality of pulsed beams before a substrate is exposed with a pattern of a mask;

obtaining an average value of energies of the detected plurality of pulsed beams; and determining, based on the obtained average value, a moving speed of said substrate during scanning exposure.

15. A scanning exposure method according to claim 14, further comprising:

adjusting an energy of a pulsed beam to be emitted to the substrate.

16. A method according to claim 13, wherein said predetermined scanning speed includes a moving speed of said substrate during an exposure of said substrate.

17. A method according to claim 13, wherein said predetermined scanning speed is determined based on an oscillation frequency of said pulsed beam.

18. A method according to claim 13, wherein said predetermined scanning speed is determined based on a width of said pulsed beam in a moving direction of said substrate.

19. A method according to claim 13, wherein an emission of said pulsed beam is started in anticipation of fluctuations of emission timing.

20. A method according to claim 19, wherein the pulsed beam has a sectional intensity distribution in a moving direction of the substrate and the intensity distribution has a slope portion at an edge thereof, and a width of said pulsed beam is determined based on a value of an intensity corresponding to said slope portion.

21. A method according to claim 14, wherein the scanning speed is determined in consideration of an oscillation frequency of said pulsed beam.

22. A scanning exposure method comprising the steps of:

determining a number of pulsed beams emitted on each point of a substrate during a scanning exposure in accordance with fluctuations of emission timing of said pulsed beam; and exposing said substrate in accordance with the determined number.

23. A scanning exposure apparatus comprising:

a beam source to emit a pulsed beam;

a drive system, kinetically connected to a mask and a substrate, which drives said mask and said substrate synchronously; and a control system, connected to said beam source and said drive system, which determines, based on fluctuations of emission timing of said pulsed beam, a number of pulsed beams emitted on each point of said substrate during a scanning exposure, and which exposes said substrate in accordance with the determined number.

24. A scanning exposure apparatus according to claim 23, wherein said drive system is directly connected to said mask and said substrate.

25. A scanning exposure apparatus comprising:

a beam source to emit a pulsed beam; and a control system to control the scanning exposure based on fluctuations of emission timing of said pulsed beam.

26. A scanning exposure method comprising:

emitting a pulsed beam; and controlling the scanning exposure based on fluctuations of emission timing of said pulsed beam.

27. A scanning exposure apparatus comprising:

a beam source which emits a pulsed beam;

a projection system to be disposed between a mask and a substrate, which projects a pattern image on one side thereof;

a detecting system which detects an energy amount of the pulsed beam from the beam source, at least part of the detecting system being provided in a path of the pulsed beam;

a driving system which moves said substrate with said mask synchronously at a speed which is determined based on an average value of the energy amounts of the pulsed beams detected by the detecting system before said substrate is exposed, at least part of the driving system being provided on the one side of the projection system.

28. An apparatus according to claim 27, wherein a number of pulsed beams emitted to each point of said substrate during a scanning exposure is determined based on the average value.

29. An apparatus according to claim 27, wherein the pulsed beam has a sectional intensity distribution in a moving direction of the substrate and the intensity distribution has a slope portion at an edge thereof.

30. An apparatus according to claim 29, wherein the number of pulsed beams is determined in consideration of a width of the slope portion.

31. An apparatus according to claim 27, wherein the scanning speed is determined in consideration of a width of said pulsed beam in a moving direction of said substrate.

32. An apparatus according to claim 31, wherein the pulsed beam has a sectional intensity distribution in a moving direction of the substrate and the intensity distribution has a slope portion at an edge thereof, and said width of said pulsed beam is determined based on a value of an intensity corresponding to said slope portion.

33. An apparatus according to claim 27, wherein the scanning speed is determined in consideration of an oscillation frequency of said pulsed beam.

34. A scanning exposure method in which an object is moved in a scanning direction relative to a pulsed beam for scanning exposure, the method comprising:

setting a proper exposure dose with respect to said object; and determining a moving speed of said object during said scanning exposure and an energy of said pulsed beam based on the set exposure dose and an oscillation frequency of said pulsed beam.

35. A scanning exposure method according to claim 34, further comprising:

obtaining a number of pulsed beams emitted to each point on said object during said scanning exposure based on said set exposure dose; and determining the energy of said pulsed beams based on the obtained number.

36. A scanning exposure method according to claim 34, further comprising:

obtaining a number of pulsed beams emitted to each point on said object during said scanning exposure based on said set exposure dose; and determining the moving speed based on the obtained number and said oscillation frequency.

37. A scanning exposure method according to claim 36, wherein said moving speed is determined based on said obtained number, said oscillation frequency and a width of said pulsed beam in said scanning direction.

38. A scanning exposure method according to claim 34, wherein the following equation is satisfied:

$$v = D * f/N1$$

where v is the moving speed of said object during said scanning exposure, f is the oscillation frequency of said pulsed beam during said scanning exposure, N1 is the number of pulsed beams emitted to each point on said object during said scanning exposure, and D is a width of said pulsed beams with respect to said scanning direction.

39. A scanning exposure method according to claim 38, wherein the following relationship is satisfied:

$$N1 \geq N2$$

where

N2 is a requisite number of pulsed beams in order to obtain a desired accuracy of exposure dose control with respect to said object.

40. A scanning exposure method according to claim 41, wherein said pulsed beams have an intensity distribution with respect to a moving direction of said object, said intensity distribution has a slope portion at an end thereof, and said N2 is determined based on a width of the slope portion of said intensity distribution.

41. A scanning exposure method in which an object is moved in a scanning direction relative to a pulsed beam for scanning exposure, the method comprising:

a first step of obtaining a number of pulsed beams emitted to each point on said object during said scanning exposure based on a proper exposure dose with respect to said object;

a second step of obtaining a requisite number of pulsed beams in order to obtain a desired accuracy of exposure dose control with respect to said object;

comparing the number of pulsed beams obtained by said first step with the number of pulsed beams obtained by said second step; and determining a moving speed of said object during said scanning exposure based on a result of the comparing.

42. A scanning exposure method according to claim 41, further comprising:

obtaining an average value of energies of said pulsed beams by emitting said pulsed beams plural times prior to said first step, wherein said first step obtains the number of pulsed beams emitted to each point on said object during said scanning exposure based on said proper exposure dose and said average value of energies.

43. A scanning exposure method according to claim 41, wherein the number of pulsed beams obtained by said second step is obtained based on discrepancies in energy of said pulsed beams.

44. A scanning exposure apparatus in which an object is moved in a scanning direction relative to a pulsed beam for scanning exposure, the apparatus comprising:

a beam source which emits a pulsed beam;

a monitor, at least part of the monitor being disposed in a path of the pulsed beam, which measures an energy amount of the pulsed beam emitted from said beam source during said scanning exposure; and a control system connected to said monitor, which obtains an average value of energies of plural pulsed beams emitted from said beam source using a result of measuring by said monitor to determine a parameter for an exposure dose control with respect to said object based on an obtained average value of energies, wherein said parameter includes a moving speed of said object during said scanning exposure.

45. A scanning exposure apparatus according to claim 44, wherein said parameter includes an energy of a pulsed beam emitted to said object during said scanning exposure.

46. A scanning exposure method in which an object is moved in a scanning direction relative to a pulsed beam for scanning exposure, the method comprising:

obtaining an average value of energies of plural pulsed beams; and determining a parameter for an exposure dose control which scanning-exposes said object based on an obtained average value of energies, wherein said parameter includes a moving speed of said object during said scanning exposure.

47. A scanning exposure method according to claim 46, wherein said moving speed is determined by said average value of energies and a proper exposure dose with respect to said object.

48. A scanning exposure method according to claim 47, further comprising:
   obtaining a number of pulsed beams emitted to each point on said object during said scanning exposure based on said average value of energies and said proper exposure dose; and
   determining said moving speed based on an obtained number of pulsed beams.

49. A scanning exposure method according to claim 48, wherein said moving speed is determined based on said obtained number of pulsed beams, a width of said pulsed beams with respect to said scanning direction and an oscillation frequency of said pulsed beams.

50. A scanning exposure method according to claim 46, wherein said parameter includes an energy of a pulsed beam emitted to said object during said scanning exposure.

51. A scanning exposure method according to claim 50, further comprising:
   obtaining a number of pulsed beams emitted to each point on said object during said scanning exposure based on said average value of energies and a proper exposure dose with respect to said object; and
   determining an energy of said pulsed beams based on an obtained number of said pulsed beams.

52. A scanning exposure apparatus comprising a radiation source having an exit window for providing radiation pulses of substantially equal energy at a predetermined repetition rate at the exit window to irradiate a substrate having a radiation-sensitive layer with a predetermined exposure dose, an imaging system for imaging the exit window on the radiation-sensitive layer, scanning means for scanning the image of the exit window and the substrate relative to each other at a scanning speed in a scan direction and a controller associated with the radiation source and the scanning means for controlling the energy of the radiation pulses and the scanning speed in dependence on the exposure dose and the repetition rate.

53. A method of making a device in which an object used in making the device is moved in a scanning direction relative to a pulsed beam for scanning exposure, the method comprising:
   setting a proper exposure dose with respect to said object; and
   determining a moving speed of said object during said scanning exposure and an energy of said pulsed beam based on the set exposure dose and an oscillation frequency of said pulsed beam.

54. A method of making a device in which an object used in making the device is moved in a scanning direction relative to a pulsed beam for scanning exposure, the method comprising:
   obtaining an average value of energies of plural pulsed beams; and
   determining a parameter for an exposure dose control which scanning-exposes said object based on an obtained average value of energies,
   wherein said parameter includes a moving speed of said object during said scanning exposure.

* * * * *